United States Patent [19]

Fitzgerald

[11] 4,227,036
[45] Oct. 7, 1980

[54] COMPOSITE FLANGED CERAMIC PACKAGE FOR ELECTRONIC DEVICES

[75] Inventor: William Fitzgerald, Asbury, N.J.
[73] Assignee: Microwave Semiconductor Corp., Somerset, N.J.
[21] Appl. No.: 943,487
[22] Filed: Sep. 18, 1978
[51] Int. Cl.² .............................................. H05K 7/20
[52] U.S. Cl. .......................... 174/16 HS; 174/52 FP; 357/81; 403/30
[58] Field of Search .......... 174/52 FP, , 52 S, 16 HS; 357/81; 403/28, 30; 428/469

[56] References Cited
U.S. PATENT DOCUMENTS

| | | | |
|---|---|---|---|
| 3,823,772 | 7/1974 | Larering et al. ................... | 403/30 X |
| 3,898,594 | 8/1975 | Hochberg et al. ................ | 357/81 X |
| 4,025,997 | 5/1977 | Gernitis et al. ................... | 357/81 X |

*Primary Examiner*—Elliot A. Goldberg
*Assistant Examiner*—D. A. Tone
*Attorney, Agent, or Firm*—Pennie & Edmonds

[57] ABSTRACT

An improved ceramic-based package for electronic devices having a composite flange for heat dissipation comprising a layer of heat conducting metal having a thermal coefficient of expansion appreciably different from that of the base secured to the base and a second layer of metal secured to the first layer having a thermal coefficient of expansion approximately equal to that of the ceramic. In a preferred embodiment, the first layer is copper, and the second is molybdenum.

6 Claims, 2 Drawing Figures

COMPOSITE FLANGED CERAMIC PACKAGE FOR ELECTRONIC DEVICES

TECHNICAL FIELD

This invention relates to a package for holding an electronic device; and, in particular, a composite flanged ceramic package particularly useful for holding a high power microwave semiconductor device.

BACKGROUND ART

Ceramic packages are used for holding electronic devices, particularly microwave transistors and the like, and for providing readily available terminals for connection to other components.

A package for high power microwave devices must satisfy a series of seemingly inconsistent requirements. While it should be small and compact, it must be strong enough to withstand stresses during assembly, during connection to other packages, and during use. While the package must electrically insulate the device, it must, at the same time, conduct heat away with a minimum of thermal resistance. In addition, it must provide reliable electrical connection from the device to the outside world while sealing the device in its own environment.

In the packaging of high power microwave devices, the provision of means for heat removal is a particularly important consideration. Heat generated during the use of high frequency power transistors, for example, can lead to temperature buildup and premature failure.

A typical ceramic package for microwave devices comprises a base of heat conducting ceramic such as beryllium oxide or alumina, ceramic side walls, and a Kovar (nickel, iron, cobalt alloy) or ceramic cap. While two or more leads penetrate the side walls to the package interior where the device is mounted, the components are all brazed or soldered together to hermetically seal the device from the ambient atmosphere.

It has proven unexpectedly difficult to provide a safe, reliable means for removing heat from the ceramic base of such packages. The simple straight-forward approach of brazing the ceramic base to a copper flange has serious difficulties because, after repeated thermal cycling, the ceramic tends to break and chip, destroying the package seal. Attempts were made to overcome this problem by interposing between the copper and the ceramic, a "buffer" layer of material such as molybdenum which has a thermal coefficient of expansion closer to that of the ceramic than copper, but these layers were not effective in preventing cracking. As a consequence, a number of manufacturers have given up on copper flanges and turned to flanges of other materials, such as Elkonite (a copper, tungsten powdered metal), having less satisfactory thermal conductivity.

DISCLOSURE OF THE INVENTION

Applicant has discovered that the cracking of the ceramic base of a copper flanged ceramic package is primarily due, not to linear stresses induced by differential thermal expansion and contraction, but to bending or flexural stresses. He has further discovered that such flexural stresses can be reduced to safe levels for the device by disposing on the side of the copper flange opposite the ceramic base, a thin layer of metal, such as molybdenum, having a thermal coefficient of expansion substantially the same as the ceramic.

BRIEF DESCRIPTION OF THE DRAWINGS

The nature, advantages and various additional features of the invention will appear more fully upon consideration of the illustrative embodiments now to be described in detail in connection with the accompanying drawings.

In the drawings.

BEST MODE FOR CARRYING OUT THE INVENTION

Figure 1:
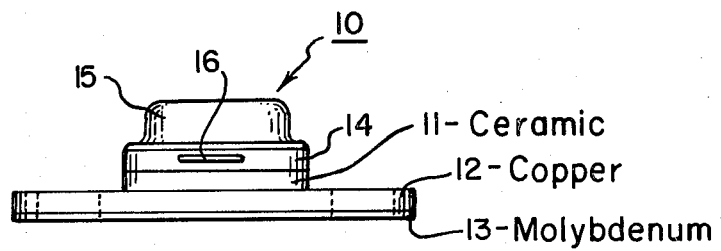
FIGS. 1 and 2 are side and top views, respectively, of a composite flanged package in accordance with the invention.
Figure 2:
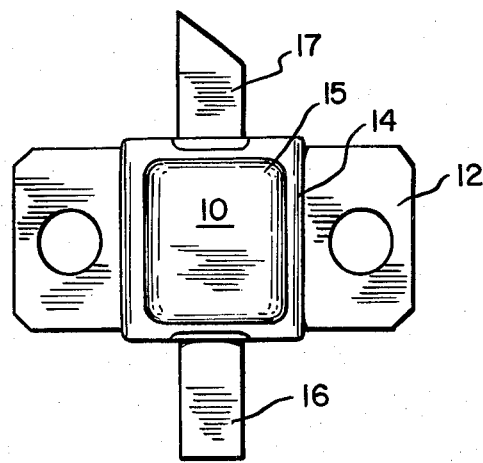

Referring to the drawings, FIGS. 1 and 2 illustrate a composite flanged package for electronic devices comprising a package, generally denoted as 10, having a ceramic base 11 secured to the first layer of a composite flange comprising layers 12 and 13. The first layer 12 comprises a thermally conductive metal, such as copper, having a thermal coefficient of expansion appreciably different from that of the ceramic, i.e. its coefficient exceeds that of the ceramic by at least 100%. Secured to the side of layer 12 opposite base 11, is a second layer 13 of heat conductive material, such as molybdenum, Kovar or tungsten, having a thermal coefficient of expansion approximating that of the ceramic by ±30%, i.e. 70% to 130% that of the ceramic. In a preferred embodiment, the ceramic base is beryllium oxide, and the layer 13 is a five mils thick layer of molybdenum. The copper layer 12 is a 57 mils thick layer and is joined to the molybdenum as by silver-copper eutectic brazing (BT brazing).

The package 10 can be any one of several ceramic-based packages known in the art. Illustrated here is a microwave power transistor package comprising a beryllium oxide base 11, an alumina side wall portion 14 and a Kovar cap 15. Emitter lead 16 and collector lead 17 can be gold-plated nickel. In the interior of the package is an electronic device (not shown), e.g. a transistor, mounted in accordance with principles well known in the art.

The advantage of providing the package with the composite flange in accordance with the invention is enhanced reliability and life expectancy as compared to devices mounted on a copper or buffered copper flange and enhanced capacity for removing heat as compared to devices mounted on Elkonite or other materials more thermally compatible with the ceramic.

While the invention has been described in connection with but a small number of specific embodiments, it is to be understood that these are merely illustrative of the many other specific embodiments which can also utilize the principles of the invention. Thus, numerous and varied devices can be made by those skilled in the art without departing from the spirit and scope of the present invention.

I claim:

1. In a package for electronic devices of the type comprising a heat conducting ceramic base member and a metal flange secured to said base for dissipating heat from said base, the improvement wherein said flange comprises a bi-layer composite bi-metallic flange comprising a first layer of heat conducting metal having a thermal conductivity and a thermal coefficient of expansion appreciably greater than that of said base and, on the side of said first layer opposite said ceramic base, a second layer of metal secured to said first layer having a thermal coefficient of expansion approximately equal to that of the ceramic.

2. A package according to claim 1 wherein said first layer comprises a metal having a thermal coefficient of expansion exceeding that of the ceramic by about 100%.

3. A package according to claim 1 wherein said first layer is copper.

4. A package according to claim 1 wherein said second layer of metal has a thermal coefficient of expansion within the range of 70% to 130% that of the ceramic.

5. A package according to claim 1 wherein said second layer comprises a metal selected from the group consisting of molybdenum, tungsten and an alloy of nickel, cobalt and iron.

6. A package according to claim 1 wherein said ceramic is beryllium oxide and said second layer of metal is molybdenum.

* * * * *